United States Patent
Lim et al.

(10) Patent No.: US 10,833,646 B2
(45) Date of Patent: Nov. 10, 2020

(54) BULK-ACOUSTIC WAVE RESONATOR AND METHOD FOR MANUFACTURING THE SAME

(71) Applicant: Samsung Electro-Mechanics Co., Ltd., Suwon-si (KR)

(72) Inventors: Chang Hyun Lim, Suwon-si (KR); Won Han, Suwon-si (KR); Moon Chul Lee, Suwon-si (KR); Tae Kyung Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 330 days.

(21) Appl. No.: 15/702,176

(22) Filed: Sep. 12, 2017

(65) Prior Publication Data
US 2018/0102751 A1    Apr. 12, 2018

(30) Foreign Application Priority Data

Oct. 12, 2016 (KR) .................. 10-2016-0132113
Apr. 3, 2017 (KR) .................. 10-2017-0043230

(51) Int. Cl.
*H03H 3/04* (2006.01)
*H03H 9/13* (2006.01)
(Continued)

(52) U.S. Cl.
CPC .......... *H03H 3/04* (2013.01); *H03H 9/02118* (2013.01); *H03H 9/132* (2013.01);
(Continued)

(58) Field of Classification Search
CPC ...... H03H 3/04; H03H 9/02118; H03H 9/132; H03H 9/174; H03H 9/173; H03H 9/02015; H03H 2003/023; H03H 2003/021
See application file for complete search history.

(56) References Cited

U.S. PATENT DOCUMENTS 5,692,279 A    12/1997 Mang et al.
8,902,023 B2    12/2014 Choy et al.
(Continued)

FOREIGN PATENT DOCUMENTS

CN    101931380 A    12/2010
CN    102301590 A    12/2011
(Continued)

OTHER PUBLICATIONS

Korean Office Action dated Feb. 26, 2018 in corresponding Korean Patent Application No. 10-2017-0043230 (7 pages in English, 6 pages in Korean).
(Continued)

*Primary Examiner* — Bryan P Gordon
(74) *Attorney, Agent, or Firm* — NSIP Law

(57) ABSTRACT

A bulk-acoustic wave resonator includes: a membrane layer disposed on a substrate and forming a cavity; a lower electrode disposed on the membrane layer; a piezoelectric layer disposed on the lower electrode; an upper electrode disposed on the piezoelectric layer, and including a frame part disposed at an edge of an active area and having a thickness greater than that of a portion of the upper electrode disposed in a central portion of the active area; and a frequency adjusting layer disposed on the piezoelectric layer and the upper electrode. The frequency adjusting layer is excluded from an inclined surface of the frame part, or a thickness of a portion of the frequency adjusting layer on the inclined surface is less than that of other portions of the frequency adjusting layer. The frequency adjusting layer is disposed on a portion of the piezoelectric layer protruding from the upper electrode.

14 Claims, 7 Drawing Sheets

(51) Int. Cl.
  *H03H 9/17* (2006.01)
  *H03H 9/02* (2006.01)
  *H03H 3/02* (2006.01)
  *H03H 9/54* (2006.01)

(52) U.S. Cl.
  CPC ............ *H03H 9/173* (2013.01); *H03H 9/174* (2013.01); *H03H 9/547* (2013.01); *H03H 2003/021* (2013.01); *H03H 2003/023* (2013.01); *H03H 2003/0442* (2013.01); *H03H 2009/02173* (2013.01)

(56) References Cited

U.S. PATENT DOCUMENTS

| | | | |
|---|---|---|---|
| 2005/0140247 | A1 | 6/2005 | Lee |
| 2007/0247260 | A1* | 10/2007 | Yanase ..................... H03H 3/02 333/187 |
| 2010/0013573 | A1* | 1/2010 | Umeda ................ H03H 9/0095 333/186 |
| 2010/0327697 | A1 | 12/2010 | Choy et al. |
| 2011/0298564 | A1 | 12/2011 | Iwashita et al. |
| 2012/0068690 | A1 | 3/2012 | Song et al. |
| 2013/0147320 | A1 | 6/2013 | Son et al. |
| 2015/0244346 | A1 | 8/2015 | Feng et al. |
| 2016/0163954 | A1 | 6/2016 | Shin et al. |
| 2017/0366156 | A1* | 12/2017 | Han ..................... H03H 9/132 |
| 2018/0152168 | A1* | 5/2018 | Han ................... H03H 9/02015 |

FOREIGN PATENT DOCUMENTS

| | | |
|---|---|---|
| CN | 103858342 A | 6/2014 |
| CN | 104868871 A | 8/2015 |
| CN | 105262455 A | 1/2016 |
| EP | 1 258 989 A2 | 11/2002 |
| JP | 2005-198233 A | 7/2005 |
| JP | 2008-5443 A | 1/2008 |
| KR | 10-2005-0072576 A | 7/2005 |
| KR | 10-2016-0069263 A | 6/2016 |
| KR | 10-2017-0141386 A | 12/2017 |

OTHER PUBLICATIONS

Chinese Office Action dated Aug. 21, 2020 in counterpart Chinese Patent Application No. 201710940292.0 (16 pages in English, 10 pages in Chinese).

* cited by examiner

BULK-ACOUSTIC WAVE RESONATOR AND METHOD FOR MANUFACTURING THE SAME

CROSS-REFERENCE TO RELATED APPLICATIONS

This application claims the benefit under 35 U.S.C. § 119(a) of Korean Patent Application Nos. 10-2016-0132113 and 10-2017-0043230 filed on Oct. 12, 2016 and Apr. 3, 2017, respectively, in the Korean Intellectual Property Office, the entire disclosures of which are incorporated herein by reference for all purposes.

BACKGROUND

1. Field

The present disclosure relates to bulk-acoustic wave resonator and a method for manufacturing the same.

2. Description of Related Art

A bulk-acoustic wave (BAW) filter is, for example, a core element in a front end module of a smartphone, or a tablet, that allows a signal within a desired frequency band, among radio frequency (RF) signals, to pass therethrough, and blocks a signal within an unwanted frequency band among the RF signals. A demand for BAW filters has increased in accordance with an increase in the market for mobile devices.

A BAW filter includes bulk-acoustic wave resonators. In a case in which Q performance, which is a quality factor of the bulk-acoustic wave resonators, is good, skirt characteristics enabling selection of only a desired band from the bulk-acoustic wave filter are good, and insertion loss and attenuation performance are improved.

In addition, in order to improve Q performance of a bulk-acoustic wave resonator, resonant energy should be confined in an active area by forming a frame around the resonator and reflecting a lateral wave generated at the time of resonation into the resonator.

To this end, the frame is generally formed to be thicker than the active area using the same material as the upper electrode, and an insulating layer is then deposited on the upper electrode and the frame to perform frequency trimming of the resonator after a releasing operation.

However, since the insulating layer deposited as described above is deposited on the entirety of the resonator including the active area of the resonator as well as the frame, the insulating layer, which is formed on an outer surface of the frame, may cause reflection loss of the lateral wave at the time of resonating, thereby causing leakage of the resonant energy. As a result, Q performance is degraded.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk-acoustic wave resonator includes: a membrane layer disposed on a substrate and forming a cavity together with the substrate; a lower electrode disposed on the membrane layer and over the cavity; a piezoelectric layer disposed on the lower electrode; an upper electrode disposed on the piezoelectric layer, and including a frame part disposed at an edge of an active area and having a thickness that is greater than a thickness of a portion of the upper electrode disposed in a central portion of the active area; and a frequency adjusting layer disposed on the piezoelectric layer and the upper electrode. The frequency adjusting layer is excluded from an inclined surface of the frame part, or a thickness of a portion of the frequency adjusting layer disposed on the inclined surface is less than a thickness of other portions of the frequency adjusting layer. The frequency adjusting layer is disposed on a portion of the piezoelectric layer protruding from the upper electrode.

The portion of the piezoelectric layer protruding from the upper electrode may be a flat surface.

The frequency adjusting layer may be disposed on the flat surface.

The frequency adjusting layer may be excluded from the inclined surface, or the thickness of the portion of the frequency adjusting layer on the inclined surface may be formed to be less than the thickness of the other portions of the frequency adjusting layer due to a trimming rate difference by a trimming operation after the frequency adjusting layer is stacked in the bulk-acoustic wave resonator.

A step portion may be disposed on a portion of the frequency adjusting layer disposed on the frame part.

The bulk-acoustic wave resonator may further include a metal pad disposed on portions of the upper electrode and the lower electrode on which the frequency adjusting layer is not formed.

In another general aspect, a bulk-acoustic wave resonator includes: a substrate; a membrane layer disposed on the substrate and forming a cavity together with the substrate; a lower electrode disposed on the membrane layer and over the cavity; a piezoelectric layer disposed on the lower electrode; an upper electrode disposed on the piezoelectric layer, and including a frame part disposed at an edge of an active area and having a thickness that is greater than a thickness of a portion of the upper electrode disposed in a central portion of the active area; and a frequency adjusting layer disposed on the piezoelectric layer and the upper electrode. The frequency adjusting layer is excluded from an inclined surface of the frame part, or a thickness of a portion of the frequency adjusting layer on the inclined surface is less than a thickness of other portions of the frequency adjusting layer. A step portion is disposed on a portion of the frequency adjusting layer disposed on the frame part.

The bulk-acoustic wave resonator may further include a metal pad disposed on portions of the upper electrode and the lower electrode on which the frequency adjusting layer is not formed.

The frequency adjusting layer may be disposed on a portion of the piezoelectric layer protruding from the upper electrode.

The piezoelectric layer may include a flat surface in the portion of the piezoelectric layer protruding from the upper electrode.

The frequency adjusting layer may be disposed on the flat surface of the piezoelectric layer.

The frequency adjusting layer may be removed from the inclined surface, or the thickness of the portion of the frequency adjusting layer on the inclined surface may be less than a thickness of the other portions of the frequency adjusting layer due to a trimming rate difference by a trimming operation after the frequency adjusting layer is stacked in the bulk-acoustic wave resonator.

In another general aspect, a method to manufacture a bulk-acoustic wave resonator includes: forming a sacrificial layer on a substrate; forming a membrane layer to cover the sacrificial layer; forming a lower electrode so that the lower electrode is disposed on the sacrificial layer; forming a piezoelectric layer on the lower electrode and the membrane layer so that a portion of the lower electrode is externally exposed and a portion of the piezoelectric layer is disposed on the sacrificial layer; forming an upper electrode on the piezoelectric layer; forming a frequency adjusting layer so that the portion of the lower electrode and a portion of the upper electrode are externally exposed; forming a metal pad on the externally exposed portion of the lower electrode and the externally exposed portion of the upper electrode; and removing the frequency adjusting layer from an inclined surface of a frame part of the upper electrode, or forming a portion of the frequency adjusting layer to have a thickness that is less than a thickness of other portions of the frequency adjusting layer.

The removing of the frequency adjusting layer from the inclined surface of the frame part, or the forming of the portion of the frequency adjusting layer to have the thickness that is less than the thickness of the other portions of the frequency adjusting layer may be performed by a trimming operation. The removing of the frequency adjusting layer and the forming of the portion of the frequency adjusting layer to have the thickness that is less than the thickness of the other portions of the frequency adjusting layer may be further performed by a trimming rate difference between a horizontal portion of the frequency adjusting layer disposed on a horizontal surface of the upper electrode and an inclined portion of the frequency adjusting layer disposed on the inclined surface.

The method may further include forming a cavity by removing the sacrificial layer.

The method may further include: forming a step portion in a part of the frequency adjusting layer disposed on a top surface of the frame part, before the removing of the frequency adjusting layer from the inclined surface of the frame part, or the forming of the portion of the frequency adjusting layer to have the thickness that is less than the thickness of the other portions of the frequency adjusting layer.

The forming of the frequency adjusting layer may include forming the frequency adjusting layer on the lower electrode, a central portion of the upper electrode, and the frame part. The frame part may be disposed at an edge of an active area of the bulk-acoustic wave resonator, and may have a thickness that is greater than a thickness of the central portion of the upper electrode.

The forming of the frequency adjusting layer may further include forming the frequency adjusting layer on a portion of the piezoelectric layer protruding from the upper electrode.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
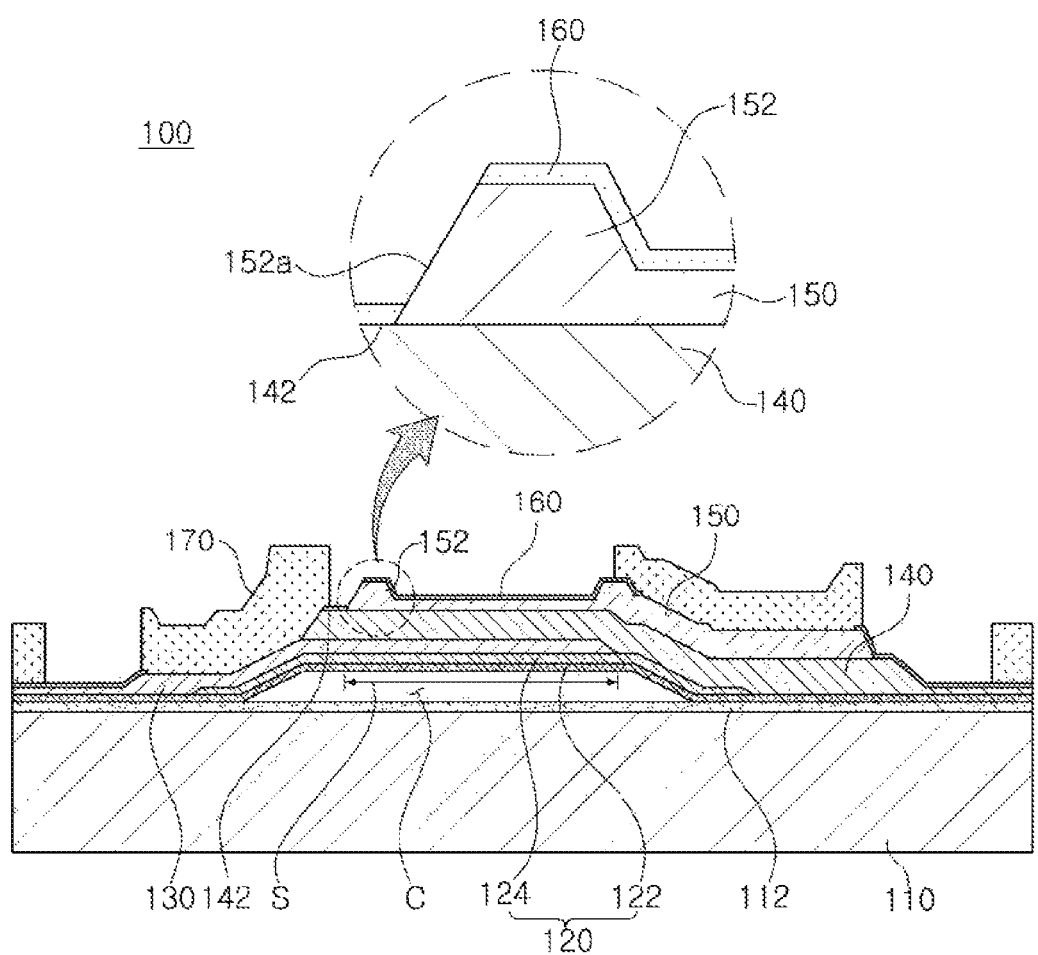
FIG. 1 is a schematic cross-sectional view illustrating a bulk-acoustic wave resonator, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," "coupled to," "over," or "covering" another element, it may be directly "on," "connected to," "coupled to," "over," or "covering" the other element, or there may be one or more other elements intervening therebetween. In contrast, when an element is described as being "directly on," "directly connected to," "directly coupled to," "directly over," or "directly covering" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, example embodiments will be described in detail with reference to the accompanying drawings.

FIG. 1 is a schematic cross-sectional view illustrating a bulk-acoustic wave resonator 100, according to an embodiment.

Referring to FIG. 1, the bulk-acoustic wave resonator 100 includes, for example, a substrate 110, a membrane layer 120, a lower electrode 130, a piezoelectric layer 140, an upper electrode 150, a frequency adjusting layer 160, and a metal pad 170.

The substrate 110 is a substrate on which silicon is stacked. For example, a silicon wafer is used as the substrate. The substrate 110 includes a substrate protective layer 112 disposed below and facing a cavity C.

The substrate protective layer 112 prevents damage to the substrate 112 when the cavity C is formed. As an example, the substrate protective layer 112 is formed of a material containing silicon nitride (SiN) or silicon oxide ($SiO_2$). That is, the substrate protective layer 112 prevents etching of the substrate 110 during an operation of removing a sacrificial layer 390 (see FIGS. 4 through 7) to be described below.

A detailed description of the operation of removing the sacrificial layer 390 will be provided below.

The membrane layer 120 is formed on the substrate 110 and forms the cavity C together with the substrate 110. In other words, the cavity C is formed between the membrane layer 120 and the substrate 110. As an example, the membrane layer 120 includes an etching preventing layer 122, and a lower electrode protective layer 124 formed on the etching preventing layer 122.

The etching preventing layer 122 is formed on the sacrificial layer 390 (FIG. 4) to be described below, and forms the cavity C together with the substrate protective layer 112 by the etching preventing layer 122 by removing the sacrificial layer 390. The etching preventing layer 122 may be formed of a material having low reactivity with halide-based etching gases such as fluorine (F), and chlorine (Cl) for removing a silicon-based sacrificial layer 390.

Further, the lower electrode protective layer 124 is disposed over the cavity C, and is formed on the etching preventing layer 122. As an example, the lower electrode protective layer 124 is formed of a material containing silicon nitride (SiN) or silicon oxide ($SiO_2$).

The lower electrode 130 is formed on the membrane layer 120, and at least a portion of the lower electrode 130 is disposed on the cavity C. As an example, the lower electrode 130 is formed of a conductive material such as molybdenum (Mo), ruthenium (Ru), tungsten (W), iridium (Ir), or platinum (Pt), or alloys thereof.

In addition, the lower electrode 130 is used as any one of an input electrode that inputs an electric signal such as a radio frequency (RF) signal, and an output electrode. For example, in a case in which the lower electrode 130 is the input electrode, the upper electrode 150 is the output electrode, and in a case in which the lower electrode 130 is the output electrode, the upper electrode 150 is the input electrode.

The piezoelectric layer 140 covers at least a portion of the lower electrode 130. In addition, the piezoelectric layer 140 converts the signal input through the lower electrode 130 or the upper electrode 150 into an elastic wave. That is, the piezoelectric layer 140 converts an electrical signal into the elastic wave by physical vibrations.

As an example, the piezoelectric layer 140 is formed by depositing aluminum nitride, doped aluminum nitride, zinc oxide, or lead zirconate titanate.

In addition, in a case in which the piezoelectric layer 140 is formed of the aluminum nitride (AlN) material, the piezoelectric layer 140 may further include a rare earth metal. As an example, the rare earth metal includes any one or any combination of any two or more of scandium (Sc), erbium (Er), yttrium (Y), and lanthanum (La). In addition, in the case in which the piezoelectric layer 140 is formed of the aluminum nitride (AlN) material, the piezoelectric layer 140 may further include a transition metal. As an example, the transition metal includes any one or any combination of any two or more of zirconium (Zr), titanium (Ti), magnesium (Mg), and hafnium (Hf).

The piezoelectric layer 140 includes a flat surface 142 in a portion that protrudes laterally from the upper electrode 150.

The upper electrode 150 is formed to cover the piezoelectric layer 140, and is formed of a conductive material such as molybdenum (Mo), ruthenium (Ru), tungsten (W), iridium (Ir), or platinum (Pt), or alloys thereof, similarly to the lower electrode 130.

The upper electrode 150 includes a frame part 152. The frame part 152 is a portion of the upper electrode 150 having a thickness greater than a thickness of the remaining portion of the upper electrode 150. In addition, the frame part 152 is disposed in an area excluding a central portion of an active area S, that is, an edge of the active area S.

In addition, the frame part 152 reflects a lateral wave generated at the time of resonating into the active area S to confine resonant energy in the active area S. In other words, the frame part 152 is disposed at the edge of the active area S to prevent vibration from escaping the active area S to the outside.

Additionally, the frame part 152 includes an inclined surface 152a.

The active area S is an area in which the lower electrode 130, the piezoelectric layer 140, and the upper electrode 150 are stacked.

The frequency adjusting layer 160 is formed on at least the piezoelectric layer 140 and the upper electrode 150. As an example, the frequency adjusting layer 160 is formed on an area excluding portions of the lower electrode 130 and the upper electrode 150 on which the metal pad 170 is formed.

Further, the frequency adjusting layer 160 is formed on the flat surface 142 of the piezoelectric layer 140. That is, the frequency adjusting layer 160 may be formed on the flat surface 142, which protrudes from the upper electrode 150.

The frequency adjusting layer 160 is not disposed on the inclined surface 152a of the frame part 152. A portion of the frequency adjusting layer 160 initially formed on the inclined surface 152a may be removed by a trimming operation, and may be removed by a trimming rate difference. In other words, since a removal rate of the portion of frequency adjusting layer 160 initially formed on the inclined surface 152a by the trimming operation is greater than a removal rate of a portion of the frequency adjusting layer 160 on a horizontal surface by the trimming operation, the portion of the frequency adjusting layer 160 initially formed on the inclined surface 152a is removed.

Accordingly, reflection loss is improved and performance is improved by removing the portion of frequency adjusting layer 160 from the inclined surface 152a of the upper electrode 150 so that the frequency adjusting layer 160 is not disposed on the inclined surface 152a.

Since a thickness adjustment of the frequency adjusting layer 160 is a final operation of manufacturing the bulk-acoustic wave resonator 100, damage to the upper electrode 150, which is exposed in the final operation, during the thickness adjustment of the frequency adjusting layer 160 is significantly decreased.

The metal pad 170 is formed on the portions of the lower electrode 130 and the upper electrode 150 on which the frequency adjusting layer 160 is not formed. As an example, the metal pad 170 is formed of a material such as gold (Au), a gold-tin (Au—Sn) alloy, copper (Cu), or a copper-tin (Cu—Sn) alloy. However, the metal pad 170 may be formed of other materials.

Figure 2:
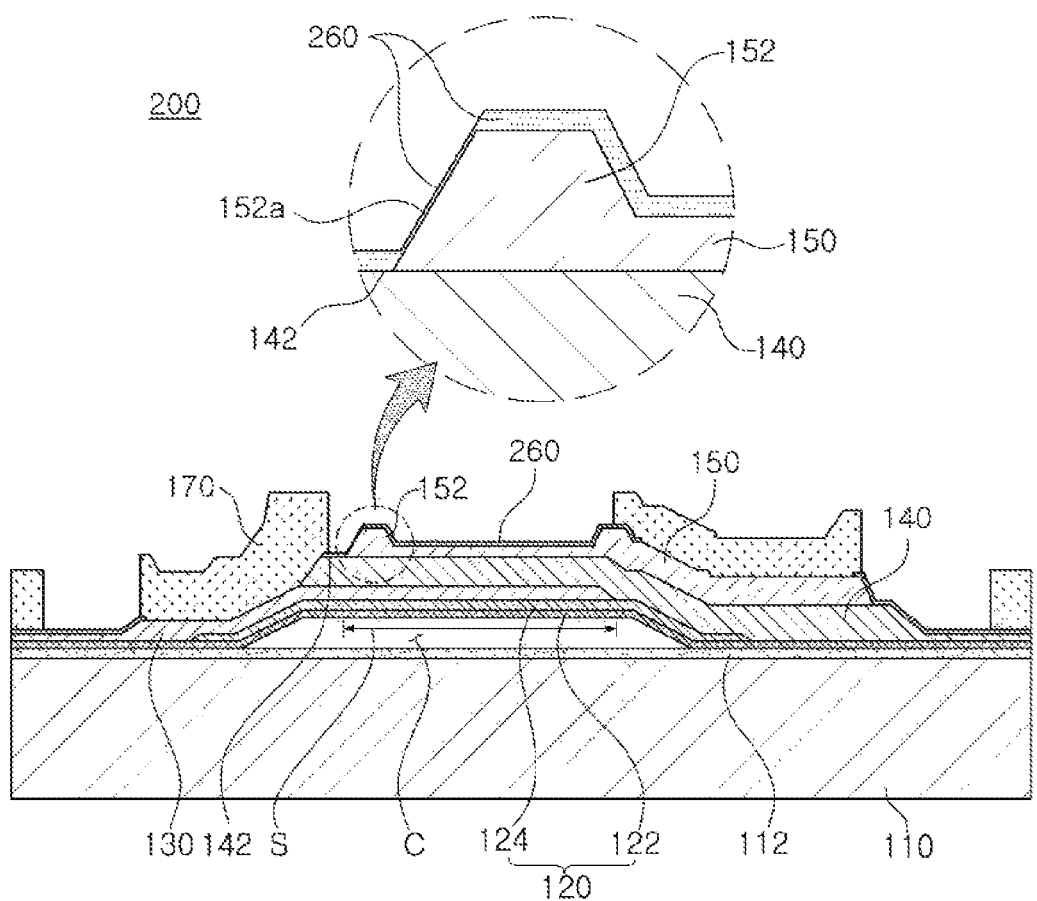
FIG. 2 is a schematic cross-sectional view illustrating a bulk-acoustic wave resonator according to another embodiment.

FIG. 2 is a schematic cross-sectional view illustrating a bulk-acoustic wave resonator 200, according to another embodiment in the present disclosure.

Referring to FIG. 2, the bulk-acoustic wave resonator 200 includes, for example, the substrate 110, the membrane layer 120, the lower electrode 130, the piezoelectric layer 140, the upper electrode 150, a frequency adjusting layer 260, and the metal pad 170.

Since the substrate 110, the membrane layer 120, the lower electrode 130, the piezoelectric layer 140, the upper electrode 150, and the metal pad 170 are the same components as the corresponding components included in the bulk-acoustic wave resonator 100 of FIG. 1 described above, a detailed description of these components will be omitted and will be replaced with the description above.

The frequency adjusting layer 260 is formed on at least the piezoelectric layer 140 and the upper electrode 150. As an example, the frequency adjusting layer 260 may is formed on an area excluding portions of the lower electrode 130 and the upper electrode 150 on which the metal pad 170 is formed.

In addition, a thickness of a portion of the frequency adjusting layer 260 formed on the inclined surface 152a of the upper electrode 150 is less than the thickness of portions of the frequency adjusting layer 260 formed on other portions of the upper electrode 150. The thickness of the frequency adjusting layer 260 is adjusted by a trimming operation. That is, the portion of the frequency adjusting layer 260 on the inclined surface 152a is formed to be thinner than the other portions of the frequency adjusting layer 260 by a trimming rate difference. In other words, since a removal rate of the portion of the frequency adjusting layer 260 on the inclined surface 152a by the trimming operation is greater than a removal rate of the a portion of the frequency adjusting layer 260 on a horizontal surface by the trimming operation, the thickness of the portion of the frequency adjusting layer 260 on the inclined surface 152a is less than the thickness of other portions of the frequency adjusting layer 260.

As an example, the thickness of the portion of the frequency adjusting layer 260 on the inclined surface 152a is 1000 Å or less.

As described above, reflection loss is improved and performance is improved by forming the thickness of the frequency adjusting layer 260 formed on the inclined surface 152a of the upper electrode 150 to be thinner than the thickness of other portions of the frequency adjusting layer 260.

Additionally, since the thickness adjustment of the frequency adjusting layer 260 is performed in a final operation of manufacturing the bulk-acoustic wave resonator 200, damage to the upper electrode 150 in the portion in which the thickness of the frequency adjusting layer 260 is formed to be thin during the manufacturing of the bulk-acoustic wave resonator 200 is significantly decreased.

Figure 3:
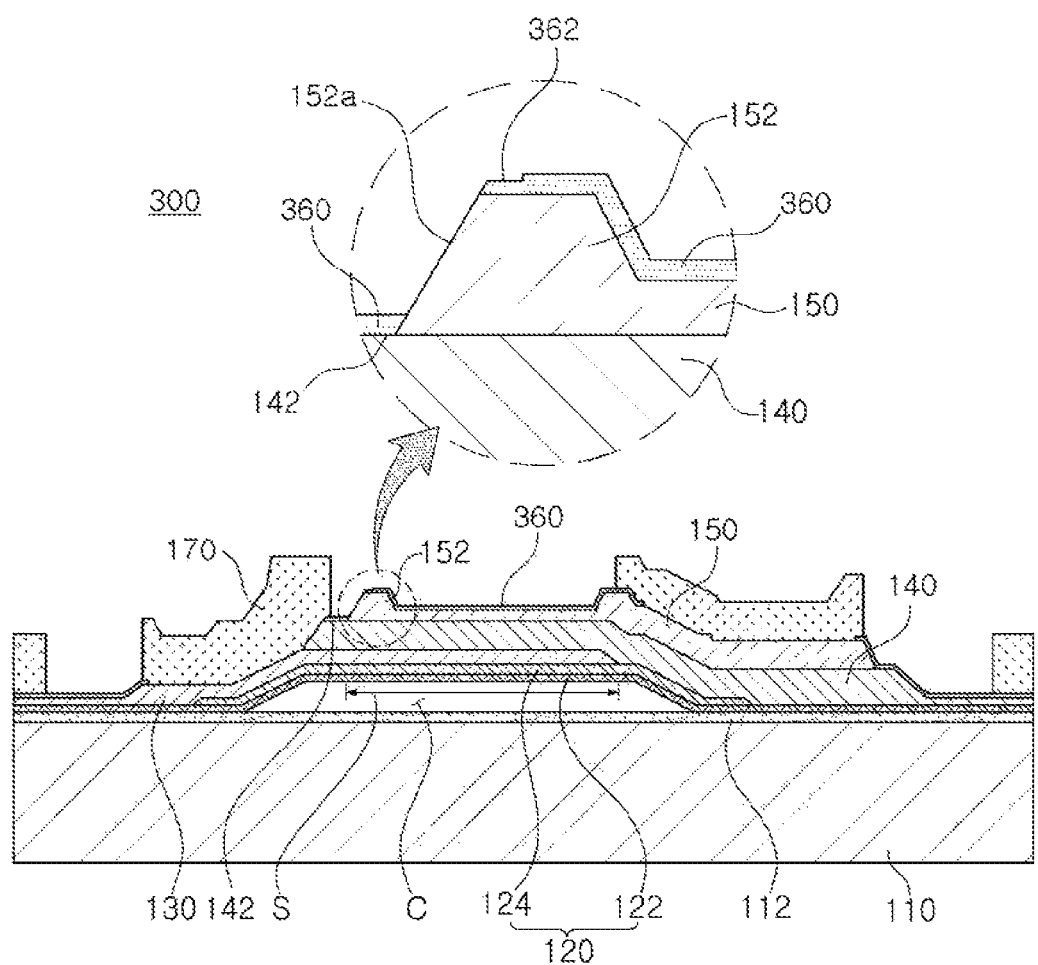
FIG. 3 is a schematic cross-sectional view illustrating a bulk-acoustic wave resonator, according to another embodiment.

FIG. 3 is a schematic cross-sectional view illustrating a bulk-acoustic wave resonator 300, according to an embodiment.

Referring to FIG. 3, the bulk-acoustic wave resonator 300 includes, for example, a substrate 110, a membrane layer 120, a lower electrode 130, a piezoelectric layer 140, an upper electrode 150, a frequency adjusting layer 360, and a metal pad 170.

Since the substrate 110, the membrane layer 120, the lower electrode 130, the piezoelectric layer 140, the upper electrode 150, and the metal pad 170 are the same components as the corresponding components included in the bulk-acoustic wave resonator 100 of FIG. 1 described above, a detailed description of these components will be omitted and will be replaced with the description above.

The frequency adjusting layer 360 is formed on at least the piezoelectric layer 140 and the upper electrode 150. As an example, the frequency adjusting layer 360 is formed on an area excluding portions of the lower electrode 130 and the upper electrode 150 on which the metal pad 170 is formed.

The frequency adjusting layer 360 is not disposed on the inclined surface 152a of the frame part 152 included in the upper electrode 150. A portion of the frequency adjusting layer 360 initially formed on the inclined surface 152a is removed from the frequency adjusting layer 360 by a trimming operation, and may be removed by a trimming rate difference. In other words, since a removal rate of the portion of the frequency adjusting layer 360 initially formed on the inclined surface 152a by the trimming operation is greater than a removal rate of the portion of the frequency adjusting layer 360 on a horizontal surface of the upper electrode 150 by the trimming operation, the portion of the frequency adjusting layer 360 initially formed on the inclined surface 152a is removed so that the frequency adjusting layer 360 is not disposed on the inclined surface 152a.

Further, the frequency adjusting layer 360 includes a step portion 362 disposed laterally inside of the inclined surface 152a and on the frame part 152 at the top surface of the upper electrode 150. Since the step portion 362 is formed in the frequency adjusting layer 360, the reflection loss is further improved.

As described above, the reflection loss is improved and the performance of the bulk-acoustic wave resonator 300 is improved by removing the frequency adjusting layer 360 from the inclined surface 152*a* of the upper electrode 150. Additionally, since the thickness adjustment of the frequency adjusting layer 360 is performed in the final operation of manufacturing the bulk-acoustic wave resonator 300, damage to the inclined surface 152*a* of the upper electrode 150 from which the frequency adjusting layer 360 is removed during the operation may be significantly decreased.

FIGS. 4 through 7 are process flowcharts illustrating a method for manufacturing the bulk-acoustic wave resonator 300, according to an embodiment.

Figure 4:
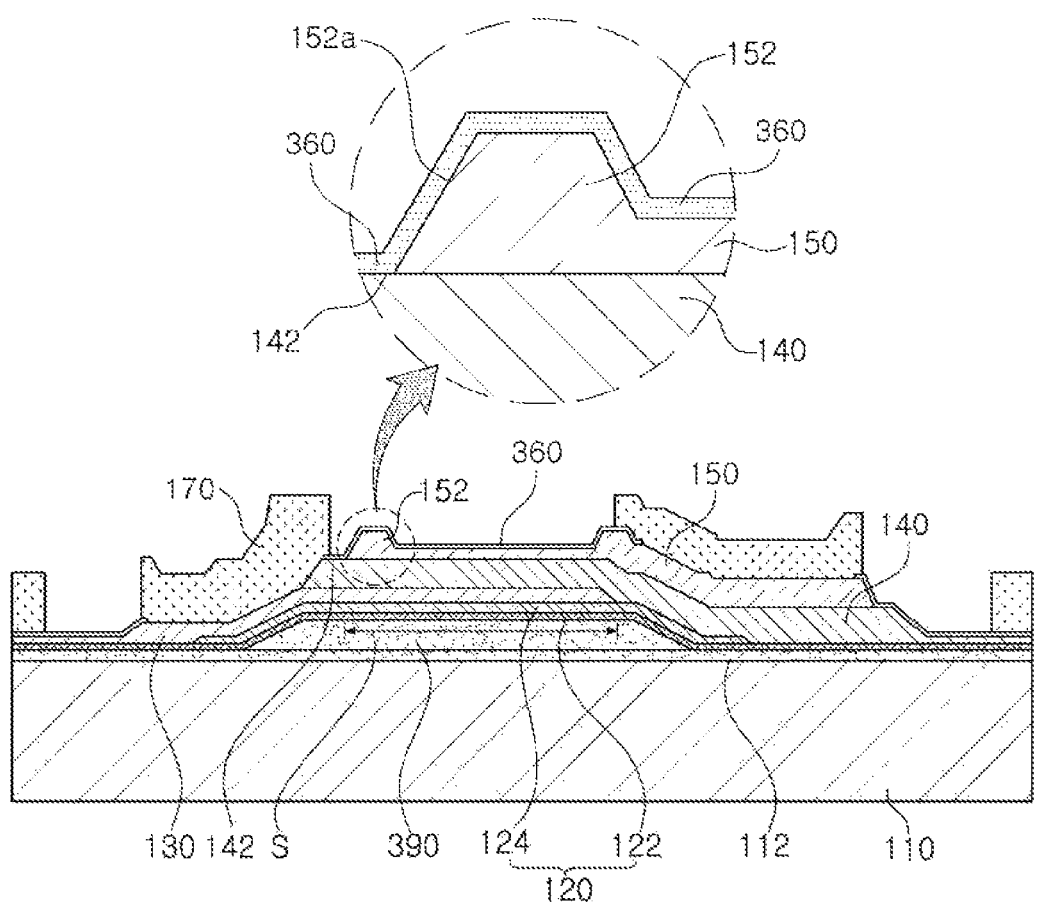
FIGS. 4 through 7 are process diagrams illustrating a method for manufacturing the bulk-acoustic wave resonator, according to an embodiment.

First, as illustrated in FIG. 4, the sacrificial layer 390 is formed on the substrate 110. The membrane layer 120 is then formed to cover the sacrificial layer 390. The etching preventing layer 122 of the membrane layer 120 is first formed on an entirety of the substrate 110 to cover the sacrificial layer 390, and the lower electrode protective layer 124 is then formed on the etching preventing layer 122 so as to be disposed on the sacrificial layer 390.

The lower electrode 130 may be then formed on the membrane layer 120 so that a portion thereof is disposed on the sacrificial layer 390. In addition, after the lower electrode 130 is formed, a portion of the lower electrode 130 may be exposed, and the piezoelectric layer 140 may be formed on the lower electrode 130 and the membrane layer 120 so that a portion thereof is disposed on the sacrificial layer 390.

The upper electrode 150 is then formed on the piezoelectric layer 140. The frame part 152 is formed in the upper electrode 150, and is an area formed to have a thickness greater than a thickness of other portions of the upper electrode 150. Further, the inclined surface 152*a* is formed on the frame part 152.

In addition, the frame part 152 is formed to be disposed at the edge of the active area S.

The frequency adjusting layer 360 is then formed so that a portion of the lower electrode 130 and a portion of the upper electrode 150 are externally exposed.

In addition, the metal pad 170 is formed on the portion of the lower electrode 130 and the portion of the upper electrode 150 that are externally exposed.

Next, after a protective layer (not shown) is formed on the frequency adjusting layer 360, the thickness of the frequency adjusting layer 360 is formed to be thin on the inclined surface 152*a* of the frame part 152 and a portion of a top surface of the frame part 152 by an etching.

That is, in a case in which the protective layer (not shown) is formed on the frequency adjusting layer 360 except for an area in which the thickness of the frequency adjusting layer 360 is to be thin and the etching is then performed, the thickness of the portions of the frequency adjusting layer 360 on the inclined surface 152*a* of the frame part 152 and a portion of the top surface of the frame part 152 inside the inclined surface 152*a* are made thin.

Figure 5:
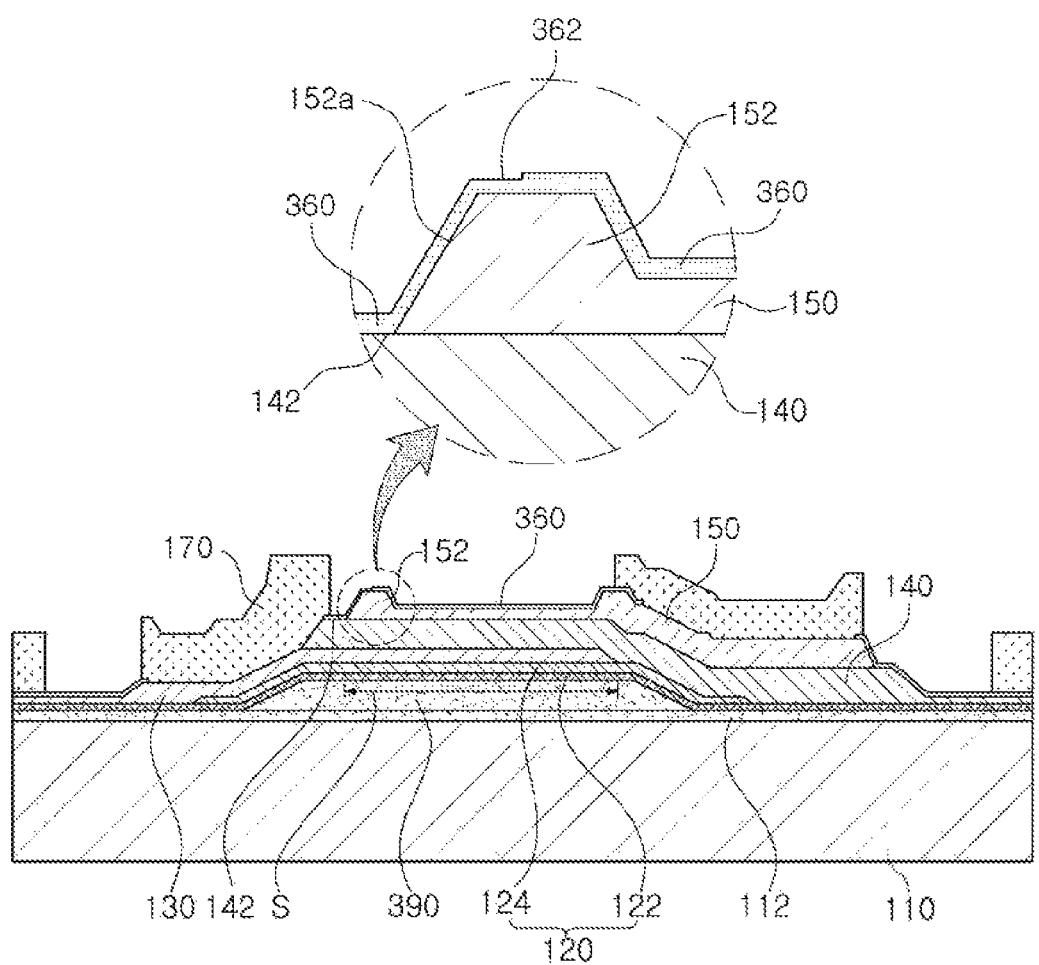

Accordingly, as illustrated in FIG. 5, the step portion 362 of the frequency adjusting layer 360 is formed on a top surface of the frame part 152 inside the inclined surface 152*a*.

Figure 6:
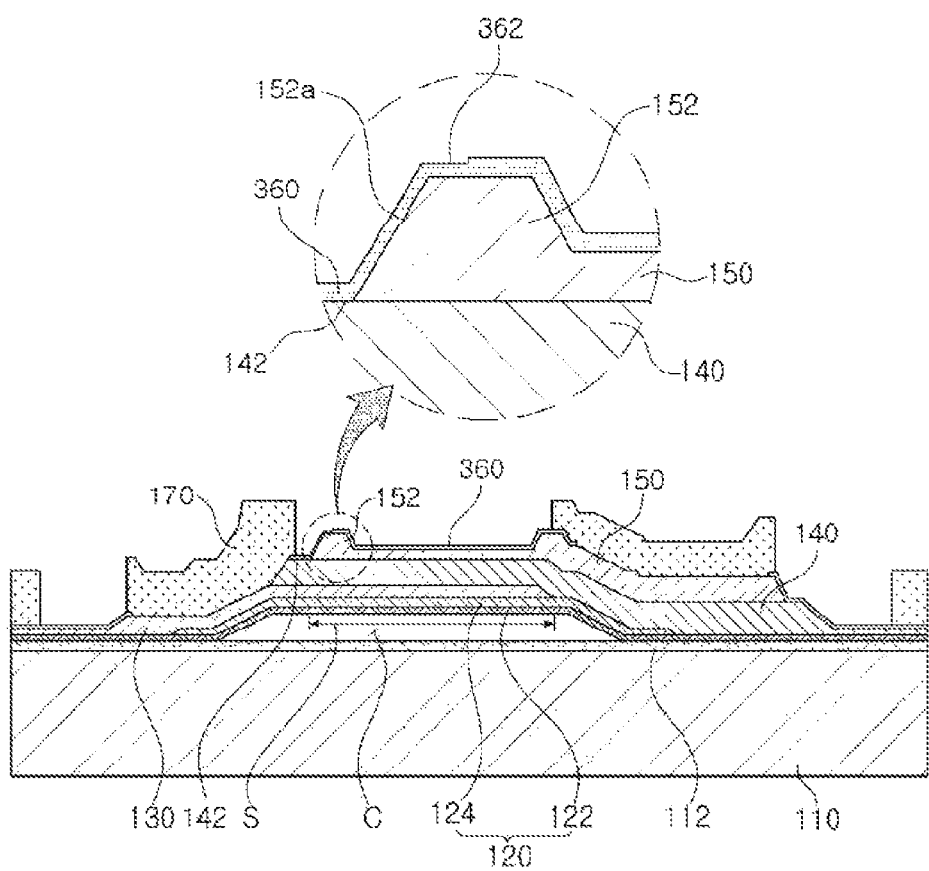

Next, as illustrated in FIG. 6, the sacrificial layer 390 is removed by a releasing operation. Accordingly, the cavity C is formed below the membrane layer 120.

Figure 7:
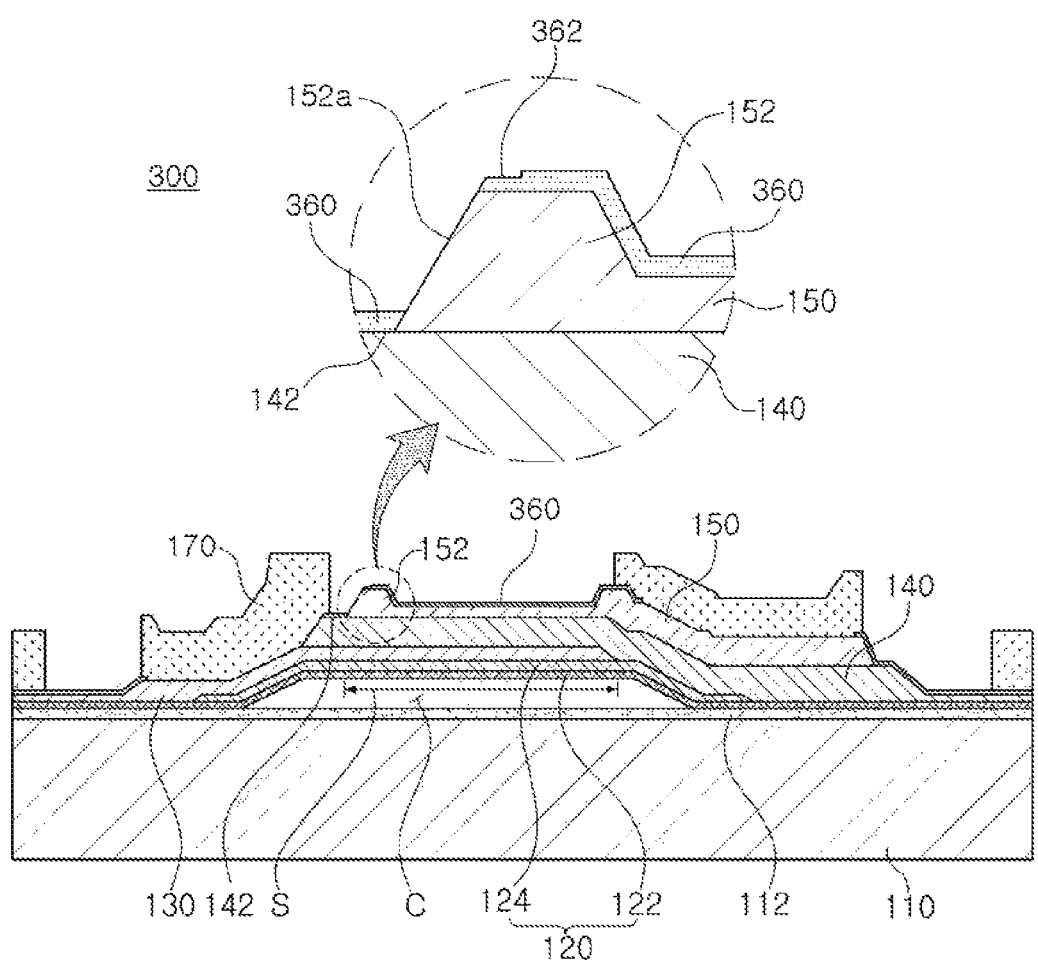

Next, as illustrated in FIG. 7, the frequency adjusting layer 360 is removed from the inclined surface 152*a*. The portion of the frequency adjusting layer 360 on the inclined surface 152*a* is removed by a trimming operation, and may be removed by a trimming rate difference. In other words, since a removal rate of the portion of frequency adjusting layer 360 on the inclined surface 152*a* by the trimming operation is greater than a removal rate of the portions of the frequency adjusting layer 360 on a flat surface portion of the upper electrode 150 by the trimming operation, the portion of the frequency adjusting layer 360 on the inclined surface 152*a* is removed.

Further, the step portion 362 is formed in the frequency adjusting layer 360 at an area inside of the inclined surface 152*a* and on the frame part 152 of the upper electrode 150.

Although the method for manufacturing the bulk-acoustic wave resonator 300 has been described above, this description applies to a method for manufacturing the bulk-acoustic wave resonator 100 of FIG. 1 when the operation of forming the step portion 362 is omitted, and to a method for manufacturing the bulk-acoustic wave resonator 200 of FIG. 2 when the operation of forming the step portion 362 is omitted, and the portion of the frequency adjusting layer 360 on the inclined surface 152*a* of the frame part 152 is formed to be thin instead of being removed. Therefore, the description of example methods for manufacturing the bulk-acoustic wave resonators 100 and 200 will be omitted.

As set forth above, according to the disclosed embodiments, the performance of the bulk-acoustic wave resonator may be improved by improving the reflection loss.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk-acoustic wave resonator comprising:
   a membrane layer disposed on a substrate and forming a cavity together with the substrate;
   a lower electrode disposed on the membrane layer and over the cavity;
   a piezoelectric layer disposed on the lower electrode;
   an upper electrode disposed on the piezoelectric layer, and comprising a frame part disposed at an edge of an active area and comprising a thickness that is greater than a thickness of a portion of the upper electrode disposed in a central portion of the active area; and
   a frequency adjusting layer disposed on the piezoelectric layer and the upper electrode, wherein the frequency adjusting layer is excluded from an inclined surface of the frame part, or a thickness of a portion of the frequency adjusting layer on the inclined surface is less than a thickness of other portions of the frequency adjusting layer, wherein the frequency adjusting layer is disposed on a portion of the piezoelectric layer protruding from the upper electrode, and wherein an end portion of the frequency adjusting layer has a same angle as the inclined surface of the frame part.

2. The bulk-acoustic wave resonator of claim 1, wherein the portion of the piezoelectric layer protruding from the upper electrode comprises a flat surface.

3. The bulk-acoustic wave resonator of claim 2, wherein the frequency adjusting layer is disposed on the flat surface.

4. The bulk-acoustic wave resonator of claim 1, wherein the frequency adjusting layer is excluded from the inclined surface, or the thickness of the portion of the frequency adjusting layer on the inclined surface is formed to be less than the thickness of the other portions of the frequency adjusting layer due to a trimming rate difference by a trimming operation after the frequency adjusting layer is stacked in the bulk-acoustic wave resonator.

5. The bulk-acoustic wave resonator of claim 1, wherein a step portion is disposed on a portion of the frequency adjusting layer disposed on the frame part.

6. The bulk-acoustic wave resonator of claim 1, further comprising a metal pad disposed on portions of the upper electrode and the lower electrode on which the frequency adjusting layer is not formed.

7. A bulk-acoustic wave resonator comprising:
a substrate;
a membrane layer disposed on the substrate and forming a cavity together with the substrate;
a lower electrode disposed on the membrane layer and over the cavity;
a piezoelectric layer disposed on the lower electrode;
an upper electrode disposed on the piezoelectric layer, and comprising a frame part disposed at an edge of an active area and comprising a thickness that is greater than a thickness of a portion of the upper electrode disposed in a central portion of the active area; and
a frequency adjusting layer disposed on the piezoelectric layer and the upper electrode,
wherein the frequency adjusting layer is excluded from an inclined surface of the frame part, or a thickness of a portion of the frequency adjusting layer on the inclined surface is less than a thickness of other portions of the frequency adjusting layer,
wherein a step portion is disposed on a portion of the frequency adjusting layer disposed on the frame part, and
wherein an end portion of the frequency adjusting layer has a same angle as the inclined surface of the frame part.

8. The bulk-acoustic wave resonator of claim 7, further comprising a metal pad disposed on portions of the upper electrode and the lower electrode on which the frequency adjusting layer is not formed.

9. The bulk-acoustic wave resonator of claim 8, wherein the frequency adjusting layer is disposed on a portion of the piezoelectric layer protruding from the upper electrode.

10. The bulk-acoustic wave resonator of claim 9, wherein the piezoelectric layer comprises a flat surface in the portion of the piezoelectric layer protruding from the upper electrode.

11. The bulk-acoustic wave resonator of claim 10, wherein the frequency adjusting layer is disposed on the flat surface of the piezoelectric layer.

12. The bulk-acoustic wave resonator of claim 7, wherein the frequency adjusting layer is removed from the inclined surface, or the thickness of the portion of the frequency adjusting layer on the inclined surface is less than a thickness of the other portions of the frequency adjusting layer due to a trimming rate difference by a trimming operation after the frequency adjusting layer is stacked in the bulk-acoustic wave resonator.

13. The bulk-acoustic wave resonator of claim 7, wherein the frequency adjusting layer is excluded from the inclined surface of the frame part.

14. A bulk-acoustic wave resonator comprising:
a membrane layer disposed on a substrate and forming a cavity together with the substrate;
a lower electrode disposed on the membrane layer and over the cavity;
a piezoelectric layer disposed in contact with the lower electrode and the membrane layer, and excluded from at least one inclined surface of the lower electrode;
an upper electrode disposed on the piezoelectric layer, and comprising a frame part disposed at an edge of an active area and comprising a thickness that is greater than a thickness of a portion of the upper electrode disposed in a central portion of the active area; and
a frequency adjusting layer disposed on the piezoelectric layer and the upper electrode,
wherein the frequency adjusting layer is excluded from an inclined surface of the frame part, or a thickness of a portion of the frequency adjusting layer on the inclined surface is less than a thickness of other portions of the frequency adjusting layer,
wherein the frequency adjusting layer is disposed on a portion of the piezoelectric layer protruding from the upper electrode, and
wherein an end portion of the frequency adjusting layer has a same angle as the inclined surface of the frame part.

* * * * *